United States Patent [19]

Tuttle et al.

[11] Patent Number: 5,612,513
[45] Date of Patent: Mar. 18, 1997

[54] ARTICLE AND METHOD OF MANUFACTURING AN ENCLOSED ELECTRICAL CIRCUIT USING AN ENCAPSULANT

[75] Inventors: Mark E. Tuttle; Rickie C. Lake; Joe P. Mousseau; Clay L. Cirino, all of Boise, Id.

[73] Assignee: Micron Communications, Inc., Boise, Id.

[21] Appl. No.: 530,747

[22] Filed: Sep. 19, 1995

[51] Int. Cl.$^6$ .................................................. H05K 3/00
[52] U.S. Cl. .......................... 174/260; 29/841; 29/832; 361/765; 257/787; 257/782
[58] Field of Search .............................. 257/787, 782, 257/783, 784; 174/255, 256, 250, 258, 260; 361/756, 749, 765; 29/841, 832

[56] References Cited

U.S. PATENT DOCUMENTS

| | | | |
|---|---|---|---|
| 4,218,701 | 8/1980 | Shirasaki | 357/72 |
| 4,502,903 | 3/1985 | Bruder | 156/153 |
| 4,621,035 | 11/1986 | Bruder | 429/152 |
| 4,814,943 | 3/1989 | Okuaki et al. | 361/400 |
| 5,336,931 | 8/1994 | Juskey et al. | 257/787 |
| 5,350,645 | 9/1994 | Lake et al. | 429/124 |
| 5,362,652 | 11/1994 | Lake | 429/127 |
| 5,389,738 | 2/1995 | Piosenka et al. | 174/52.4 |
| 5,422,514 | 6/1995 | Griswold et al. | 257/699 |
| 5,477,047 | 12/1995 | Nakagawa et al. | 250/208.1 |
| 5,536,466 | 7/1996 | Ogawa et al. | 264/400 |

*Primary Examiner*—Laura Thomas
*Attorney, Agent, or Firm*—Stephen A. Gratton

[57] ABSTRACT

An enclosed electrical circuit and method for manufacturing the electrical circuit are provided. Initially a flexible substrate is formed with a plurality of electrical circuits. By way of example, each circuit can contain a conductive trace, a battery and a die, all in electrical communication. During the manufacturing process, a barrier is placed on the substrate and a curable encapsulant is poured into a cavity formed by the barrier and the substrate to encapsulate each circuit. The barrier can be formed as a compartmentalized dam having a separate cavity for each circuit, as a perimeter dam having a single cavity, or as a spacer sheet having a separate cavity for each circuit formed by a pattern of cut outs. Following the encapsulation step, the electrical circuits can be singulated into separate encapsulated circuits.

34 Claims, 5 Drawing Sheets

ARTICLE AND METHOD OF MANUFACTURING AN ENCLOSED ELECTRICAL CIRCUIT USING AN ENCAPSULANT

FIELD OF THE INVENTION

The present invention relates to electrical circuits and their method of manufacture. More specifically, the present invention relates to an enclosed electrical circuit wherein the circuit components are formed on a flexible substrate and encapsulated with a curable material.

BACKGROUND OF THE INVENTION

Advancements in semiconductor technology have lead to the production of large scale integrated circuits (e.g., chips) which have brought about a revolution in the electronics industry. Packaged and unpackaged semiconductor dice and associated micro-circuitry are now widely used in the production of a variety of electronic devices (e.g., portable computers, calculators, watches, cordless telephones, radios, tape recorders, security systems, etc.). As the development of such portable electronic devices continues, a need has arisen for advancements in the technology relating to forming and packaging devices which employ micro-circuitry.

One of the problems associated with conventional micro-circuitry is that the components typically are mounted on a rigid substrate such as a printed circuit board. This substrate must be such that its structural integrity is sufficient to support the weight of the components and to protect the components from damage. The resulting structural rigidity is often a detriment. Some applications require some flexibility in the substrate to accommodate odd configurations or to avoid breaking of the substrate upon impact with other objects.

To allow the miniaturization to advance while providing sufficient support and flexibility, enclosed micro-circuits have evolved. In the past, these enclosed micro-circuits were sometimes manufactured using a flexible substrate, for example, polyester. A conductive trace was formed on the substrate and various electronic components were then attached to substrate in electrical communication with the conductive trace to form the micro-circuit. The micro-circuit was enclosed by bonding a second polyester sheet over the top of the circuitry. In this configuration, the micro-circuitry was enclosed by a flexible polyester sheet on either side of the micro-circuit.

The method of manufacturing the micro-circuit by enclosing it within two polyester sheets has been somewhat successful. On the other hand, if the components of the circuit are too large, this method of manufacture does not function satisfactorily. Specifically, in the situation where components are more than 1.0 mm tall, the top, and sometimes both the top and bottom sheet, had to stretch over or around the oversized component. The unequal stretching of the top and bottom sheets resulted in wrinkles in the sheets and misalignment between the sheets. Both the wrinkles and the misalignment are unacceptable.

The unacceptable nature of this design was especially apparent where components approached 2.5 mm or more in thickness. Examples of larger components would be batteries which are often necessary for a self-contained electrical circuit. Likewise, this enclosed micro-circuit failed where components had variable heights and outside configurations. As was the case with individually excessive heights, the unequal heights and unequal configurations resulted in stretching, bunching and misalignment. When manufacturers attempted to build arrays of enclosed micro-circuits, they found that the stretching, bunching and misaligning problems were additive and necessitated even thinner components and more equally spaced and sized components to fall within acceptable production limits.

For some applications, a rugged, completely self-contained micro-circuit capable of receiving information, storing information and transmitting information, without physical connection to other components is necessary. The previously described enclosed circuit design was not able to accommodate this need.

In view of the deficiencies in the prior art, the present invention is directed to an improved micro-circuit design that allows the circuit components to be enclosed in a flexible package. Accordingly, it is an object of the present invention to provide an improved micro-circuit and method of manufacture.

It is a further object of the present invention to provide an enclosed micro-circuit that is inexpensive and easy to manufacture, yet offers a high degree of reliability while minimizing the possibility of damage to the internal components.

It is yet another object of the present invention to provide a micro-circuit that is enclosed using a flexible substrate and an encapsulant that entirely surrounds the components, yet still allows a relatively high degree of flexibility.

It is a still further object of the present invention to provide a micro-circuit that can be manufactured in multiple units and then singulated into individual micro-circuits.

It is a still further object of the present invention to provide a self-contained, enclosed micro-circuit able to receive information, store the information in a memory and transmit information as required.

Other objects, advantages and capabilities of the present invention will become more apparent as the description proceeds.

SUMMARY OF THE INVENTION

In accordance with the present invention, an improved micro-circuit and a method for manufacturing the micro-circuit are provided. The micro-circuit is formed on a flexible substrate and is entirely enclosed by an encapsulant. In addition, the micro-circuit includes a conductive trace (or pattern of traces) formed on the flexible substrate and one or more electrical components (e.g., batteries, dies, antennae) mounted to the substrate in electrical communication with the conductive trace. Preferably a conductive adhesive (e.g., silver filled conductive epoxy, z-axis epoxy) is used to attach the components to the substrate and to establish an electrical connection between the components and conductive trace.

Following formation of the conductive trace, and mounting of the components to the flexible substrate, the entire micro-circuit is encapsulated using a curable encapsulant. To accomplish this step, a barrier is formed around the components of the circuit. This barrier can be in the form of a dam which surrounds a single micro-circuit or an entire array of micro-circuits. The barrier can also be in the form of a spacer sheet having a separate cut-out for each micro-circuit of an array. The barrier can be attached to the substrate or merely maintained in temporary contact with the substrate to prevent the encapsulant material from leaking out.

With the barrier installed, a single cavity or plurality of separate cavities are formed by the substrate and the barrier. The components of the circuit are located within the cavity (or cavities) and an encapsulant in a viscous form is placed into the cavity (or cavities) such that it completely covers the components and the circuit. The encapsulant is then cured or partially cured. Once the encapsulant has hardened, or partially hardened to a stable non-flowing gel, the barrier can be removed or incorporated as a part of the encapsulated assembly. Preferably the micro-circuits are fabricated and encapsulated in a multiple array and are then singulated into individual micro-circuits using cutting, routering or shearing. If desired, the barrier can be coated or formed with a releasing agent (e.g., Teflon layer) such that the barrier can be more easily separated from the encapsulant and the substrate after the manufacturing process is completed. This would also allow the barrier to be reused multiple times.

Such a packaged micro-circuit can also be formed with a logo, or other graphic material, by utilizing a transparent substrate and printing a reverse image on the substrate prior to formation of the conductive trace. In this case the image is viewed through the substrate and is protected by the substrate.

A method for manufacturing an enclosed micro-circuit, generally stated, includes the steps of: forming a flexible substrate; forming a circuit trace on the substrate; mounting electrical components on the substrate in electrical communication with the circuit trace to form a micro-circuit; attaching a barrier to the substrate to form a cavity around the micro-circuit; and then encapsulating the micro-circuit by depositing a curable encapsulant into the cavity. The barrier can then be removed or incorporated as part of the packaged micro-circuit. Additionally the micro-circuit can be formed as an individual unit or as part of an array that is later singulated into individual units.

DETAILED DESCRIPTION OF THE PREFERRED EMBODIMENTS

Figure 1:
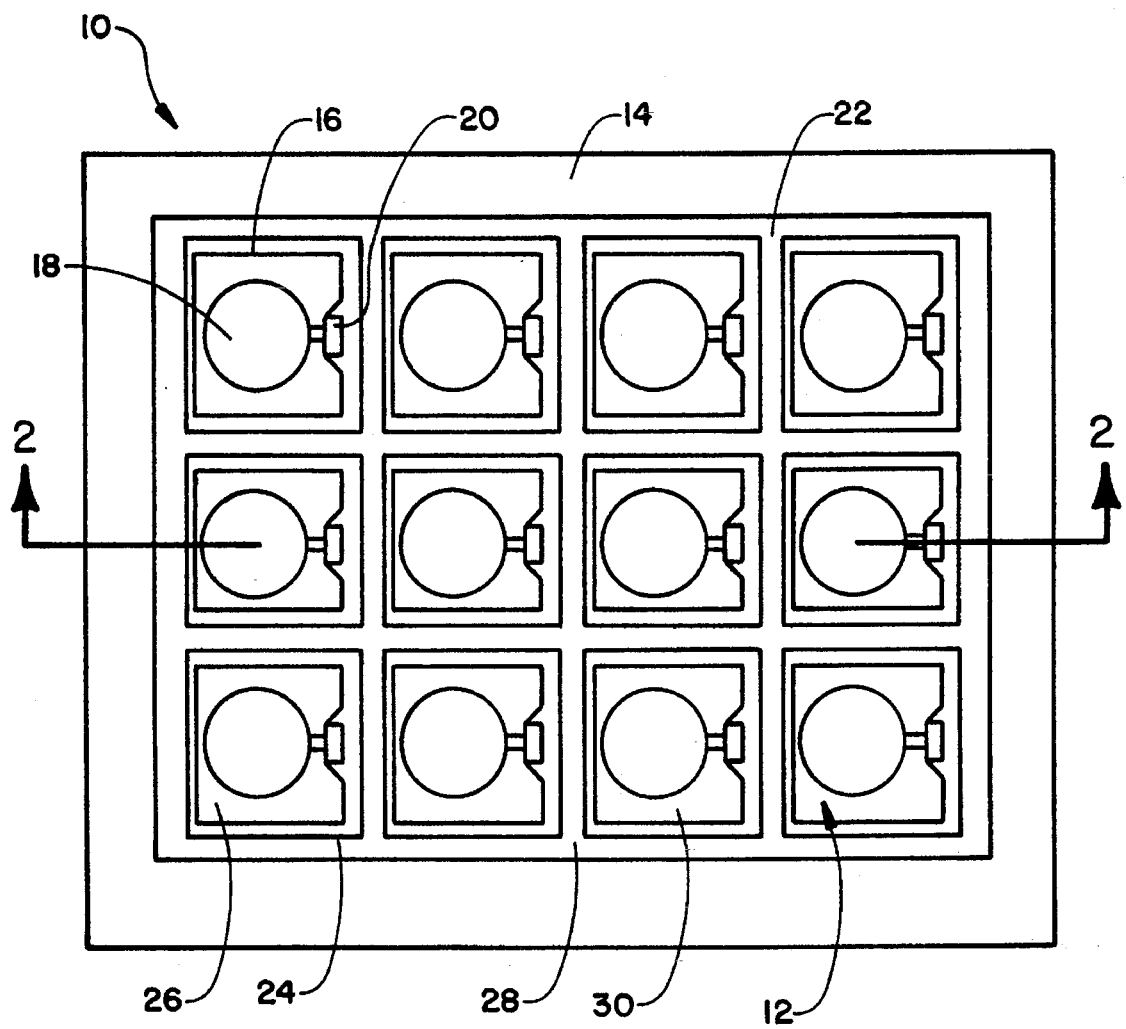
FIG. 1 is a top view of an array of micro-circuits constructed in accordance with the present invention and shown prior to singulation.
Figure 2:
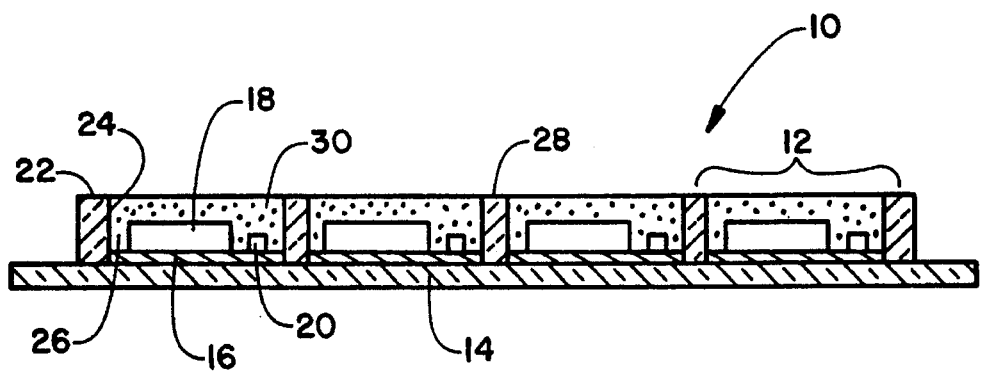
FIG. 2 is a cross-section view along line 2—2 in FIG. 1.

Referring initially to FIGS. 1 and 2, a circuit array manufactured according to the present invention is shown and generally designated 10. The circuit array 10 is shown following encapsulation but prior to singulation. Circuit array 10 is comprised of twelve individual circuits 12. However, a particular array can have a fewer or greater number of circuits 12.

The circuit array 10 includes a substrate 14. The substrate 14 can be made of a number of materials which are known in the art. Preferably, to allow the finished product to remain flexible, the substrate 14 should be made of a flexible material such as polyester or PET. However, other suitable materials having the desired characteristics could be used as well. Furthermore, the substrate 14 is preferably very thin which can also contribute to its flexibility. By way of example and not limitation, the substrate 14 can be formed with a thickness of from 0.0009 inches (0.9 mils) to 0.010 inches (10 mil).

Each circuit 12 includes a conductive trace 16 formed on the substrate 14. The conductive trace 16 can be formed as a single trace or as a pattern of conductive traces. The particular pattern or configuration of the conductive traces 16 is not critical for the present invention. Instead, the pattern or configuration of the conductive trace 16 is dependent upon the type of circuit and the types and numbers of components to be used. The conductive traces 16 can likewise be made of a number of materials and compositions, all of which are well known in the art. For example, a conductive ink can be applied to the substrate 14 using a conventional screen printing method. Alternatively, the conductive trace 16 can be a patterned metal layer formed on substrate 14 using a conventional deposition, photopatterning and etching process.

Attached to or mounted on the substrate 14 are one or more electrical components. In the particular embodiment shown in FIGS. 1 and 2, a battery 18 and a semiconductor die 20 are mounted to the substrate 14. Other circuitry and circuit components (e.g., resistors, diodes, antennae) can also be included in the circuit 12 as required. Furthermore, these other circuit components can be separate members attached to the substrate 14 or can be integral components formed by screen printing or other deposition processes.

Preferably the battery 18 is a thin coin cell battery. Furthermore, in order to facilitate the mounting of the battery 18 onto the substrate, the battery 18 is preferably of a type having both the positive and the negative terminals on one side of the battery and substantially co-planar to one another. A suitable battery and contact assembly is described in U.S. Pat. No. 5,558,699 entitled "Improved Battery and Contact Assembly and Method of Manufacture For Mounting A Battery". The disclosure of that patent is hereby incorporated by reference.

The battery 18 and the die 20 are preferably mounted onto the substrate 14 using conductive adhesive such as a silver filled conductive epoxy or a z-axis anisotropic epoxy. The conductive adhesive also establishes an electrical connection with the conductive trace 16. The battery 18 is positioned on substrate 14 such that the positive terminal and the negative terminal of battery 18 make contact with appropriate portions of the conductive trace 16. Likewise, the bond pads of die 20 are placed such that they are in electrical contact with the appropriate portions of conductive trace 16. Constructed as such, the conductive trace 16, the battery 18 and the die 20 form the circuit 12.

Following the formation of the circuits 12 on the substrate 14, a barrier is formed for encapsulating the circuits 12. In the particular embodiment illustrated in FIGS. 1 and 2, the barrier is a compartmental dam 22 that encloses each circuit 12 separately. The compartmental dam 22 is preferably formed of a thin walled rigid material such as stainless steel or hard plastic. The compartmental dam 22 includes an opening 24 for each separate circuit 12. The openings 24 are shown having a substantially square configuration. However, other shapes such as polygonal, round or oval can also be used.

As also shown in FIGS. 1 and 2, the compartmental dam 22 is placed in contact with the substrate 14 to prevent the encapsulating material from leaking out. The dam 22 can be maintained in contact with the substrate under its own weight or by using a clamp or additional weight. With the dam 22 placed in contact with the substrate 14, the openings 24 and the substrate 14 form a cavity 26 for each circuit 12. Each circuit 12 is thus surrounded on four sides by the dam 22 and at the bottom by the substrate 14. The height of the dam 22 is preferably sufficient such that the top surface 28 of the dam 22 is higher than the top of the highest circuit component. The top edge of the dam 22 can also be contoured to conform to the surface topography of the circuit components.

Filling each cavity 26 and completely encapsulating the circuit components is an encapsulant 30. The encapsulant 30 can be made from a variety of materials, any of which can be cured or dried from a viscous or liquid state to a hardened state. Preferably the encapsulant 30 comprises a two-part epoxy and can include pigments or carbon to make the encapsulant opaque. In FIGS. 1 and 2 the encapsulant 30 is shown as transparent to allow viewing of the components. The particular formulations of the epoxy are a design consideration that are dependent on the desired curing times, curing methods, resulting hardness and resulting flexibility of the encapsulant 30. As those skilled in the art will appreciate, the particular formulation can be varied to achieve the particular characteristics desired. In addition, curing can be effected in stages such that a partial cure can be performed to allow removal of the dam 22 followed by a total cure without the dam 22.

Furthermore, while the cavities in FIG. 2 are preferably completely filled by the encapsulant 30, the encapsulant 30 does not need to completely fill the cavity for the present invention. In some situations it is desirable that the encapsulant 30 does not completely cover the components or is deposited with different thicknesses on different portions of the substrate.

Once the encapsulant 30 is cured or hardened to its final state, the circuit array 10 can be singulated to separate the individual enclosed circuits 12. The singulation process can be by routering or shearing or any other method known in the art without departing from the scope and spirit of the present invention. Depending on the desired characteristics of the particular desired enclosed circuit 12, the singulation or separation can result in the particular enclosed circuits having portions of the dam 22 remaining or completely trimmed away. Furthermore, in order to facilitate removal of the dam 22 from the encapsulant 30, it is possible to apply a releasing agent to the dam 22 prior to mounting the dun 22 on the substrate 14 and prior to depositing the encapsulant into each cavity 26. The releasing agent can be an anti-stick material, such as a mold release agent, that is applied to the dam prior to use or a permanently bonded material such as Teflon.

Figure 3:
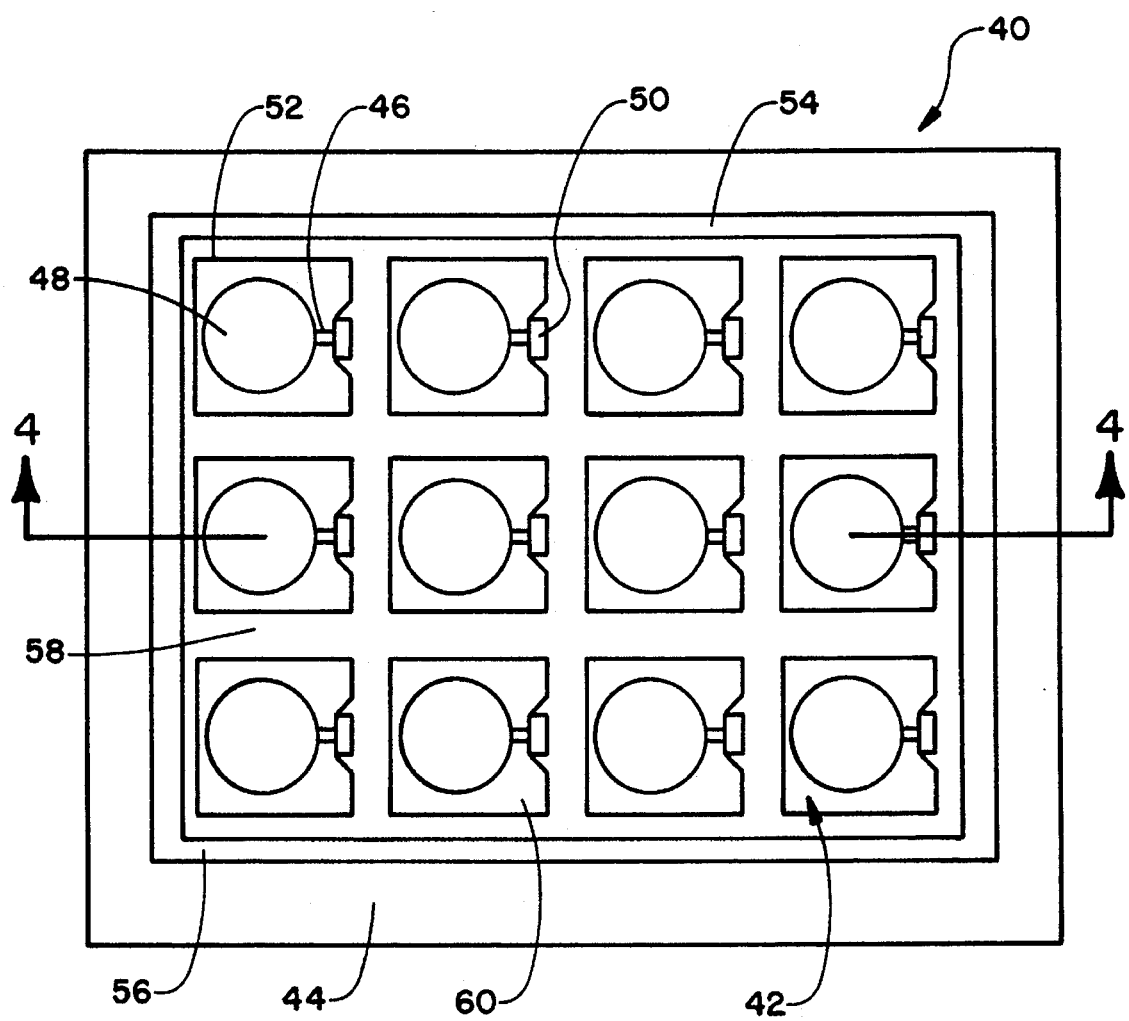
FIG. 3 is a top view of an array of micro-circuits constructed in accordance with an alternate embodiment of the invention and shown prior to singulation.
Figure 4:
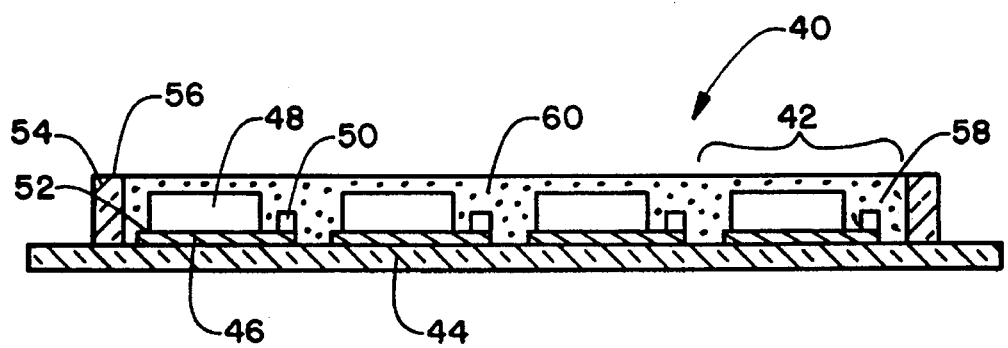
FIG. 4 is cross-sectional view taken along line 4—4 in FIG. 3.

An alternate embodiment of the present invention is shown in FIGS. 3 and 4. In FIGS. 3 and 4, the circuit array of enclosed circuits is generally designated 40. As was the case for the circuit array shown in FIGS. 1 and 2, circuit array comprises an array of twelve enclosed circuits 42. The alternate embodiment is substantially similar to the embodiment shown in FIGS. 1 and 2 except that a barrier for encapsulation is formed as a perimeter dam 54.

The circuit array 40 has as its foundation, a substrate 44. The substrate 44 can be made of any of a number of materials, but is preferably made of a flexible polyester material or PET to allow the final product to remain flexible. Additionally, using a flexible polyester or PET allows the substrate to have a minimal thickness while maintaining sufficient strength.

A conductive trace 46 is formed on the substrate 44. The conductive trace 46 can be formed as previously described. Mounted on the substrate 44 are a variety of electrical components. As was the case in the prior embodiment, a battery 48 and a die 50 are mounted onto the substrate 44. Preferably, these components are attached to the substrate 44 and electrically connected to the conductive trace 46 using a conductive adhesive and preferably a silver filled epoxy adhesive as previously described.

A portion of the trace 46 is formed as an antenna 52. The antenna 52 could also be formed as a separate component mounted onto the substrate. By including the antenna 52, each circuit 42 can communicate with the outside world using RF signals instead of requiring a hard-wired connection. In addition, information transmitted to the antenna 52 can be stored within the die 50. The circuits 42 can thus be used to receive information, store information and transmit information.

The perimeter dam 54 is mounted or attached to the substrate 44 substantially as previously described. The perimeter dam 54 is mounted onto substrate 44 such that it encompasses the periphery of the twelve enclosed circuits 42. The height of the perimeter dam 54 is such that the top surface 56 of the dam 54 is higher than the tallest component utilized within the circuits 42. The perimeter dam 54 in combination with the substrate 44, provides a single cavity 58 containing all twelve enclosed circuits 42. During an encapsulation step the cavity 58 is filled with an encapsulant 60. As with the prior embodiment, the encapsulant 60 can be made of any of a variety of materials (e.g., two part room temperature curing epoxy) which can be cured or hardened from a liquid state to a hardened state.

Once the encapsulant 60 is in its hardened state, the individual enclosed circuits 42 can be singulated or separated from each other by cutting, routering or shearing or other methods known in the art. If desired, the perimeter dam 54 can be trimmed from the particular individual circuits 42 by similar methods. Additionally in order to facilitate separation of the perimeter dam 54 from the encapsulant 60 and the substrate 44, a releasing agent can be applied to the perimeter dam 54 prior to mounting the dam to the substrate 44 and prior to filling the cavity 58 with encapsulant 60. Preferably, sufficient encapsulant 60 is utilized to give each enclosed circuit 42 a substantially flat top surface. As can be seen, the resulting circuit is completely encapsulated between the encapsulant 60 and substrate 44. On the other hand, because of the flexible nature of the substrate as well as the encapsulant, some flexing can still be possible.

Figure 5:
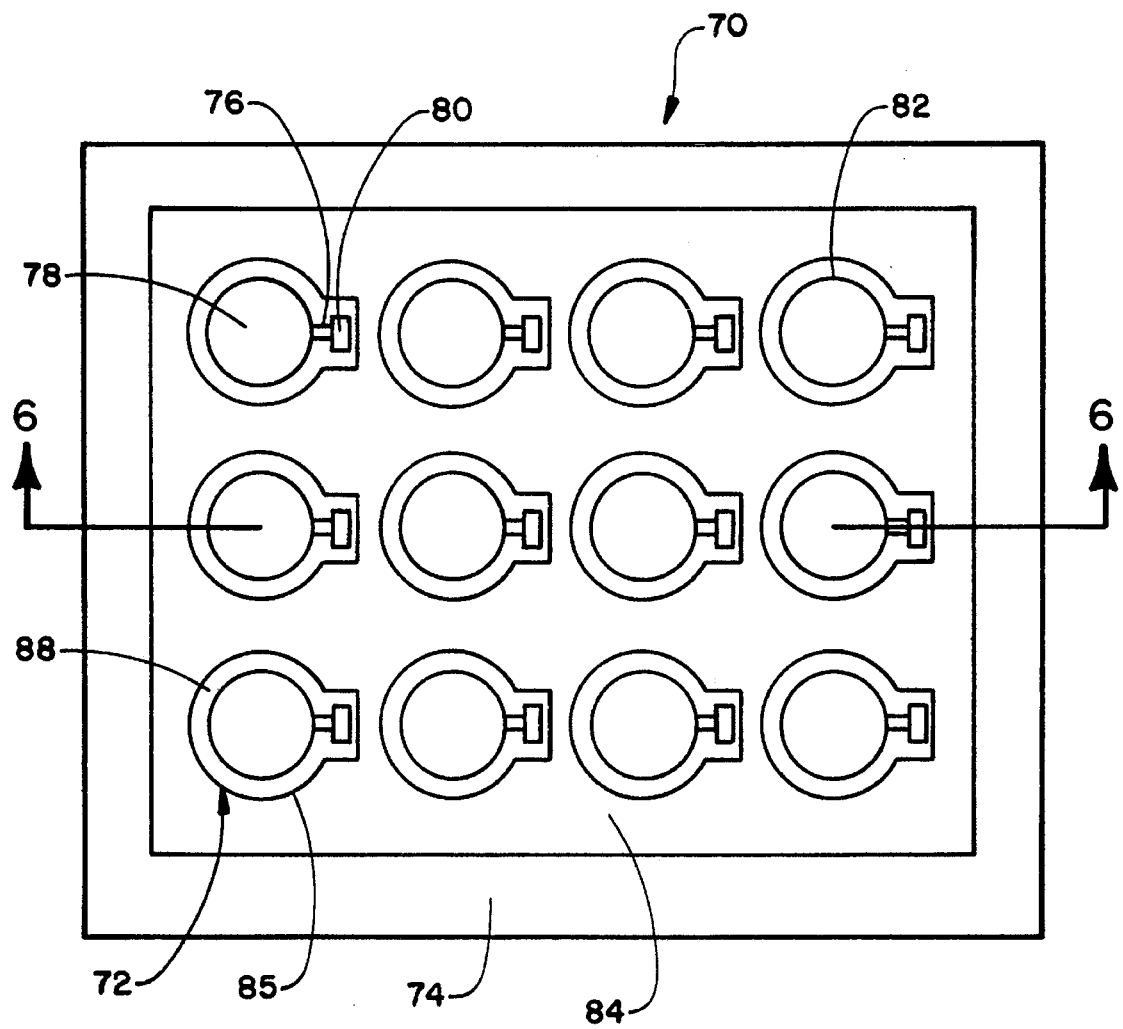
FIG. 5 is a top view of an array of micro-circuits constructed in accordance with an alternate embodiment of the invention and shown prior to singulation.
Figure 6:
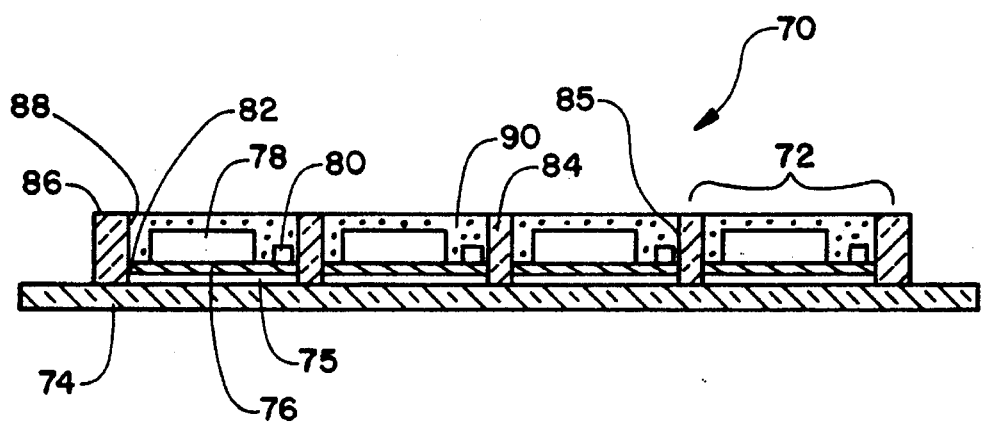
FIG. 6 is a cross-sectional view taken along line 6—6 in FIG. 5.

Still another enclosed circuit array according to the present invention is shown in FIGS. 5–6 and is generally designated 70. Circuit array 70 as shown includes 12 individual enclosed circuits 72 prior to singulation. The alternate embodiment is substantially similar to the embodiment shown in FIGS. 1 and 2 except that a barrier for encapsulation is formed as a spacer sheet 84 having a cut out for each circuit 72.

As was the case for previously described embodiments, a substrate 74 is included in the array 70. In this embodiment, the substrate 74 is flexible and substantially transparent. Preferably the substrate 74 is made of polyester or PET and is approximately 0.9 mils (0.0009 in.) to 10 mils (0.010 in.) thick. Other materials and thicknesses can be used without departing from the scope and spirit of the present invention.

An ink layer 75 (FIG. 6) is applied to the substrate 74. The ink layer 75 permits the formation of numbering, letter logos, graphic designs and the like on the inside surface of substrate 74. The ink layer 75 can comprise multiple colors of ink and can be applied using known screen printing methods or other comparable methods. Because the lettering, numbers logos or graphic designs are to visible and viewed through the substrate 74, the images can be applied in a reversed orientation.

Mounted onto substrate 74 and ink layer 75 are a variety of electrical components. As was the case in the prior embodiments, a conductive trace 76, a battery 78 and a die 80 are mounted onto substrate 74. The conductive trace 76 is preferably formed as described above by screen printing or etching. Also, the battery 78 and die 80 are preferably attached to the substrate 44 using a conductive adhesive as previously described. In addition as before, a portion of the trace 76 is formed as an antenna 82.

Mounted to the substrate 74 is a barrier formed as a spacer sheet 84. The spacer sheet 84 is preferably made of a flexible material like polycarbonate. The spacer sheet 84 is formed with a plurality of openings 85 (or cutouts) having a shape that closely matches the peripheral shape of the circuits 72. The openings 85 form a cavity 88 for encapsulating each circuit 72. The height or thickness of sheet 84 is such that the top surface 86 of the sheet 84 is higher than the tallest component utilized within the circuit.

The encapsulant 90 is poured into the cavity 88 for each circuit 72. As before, the encapsulant 90 can be made of any of a variety of materials which can be cured or hardened from a liquid state to a hardened state.

Once the encapsulant 90 is in its hardened state, the individual enclosed circuits 72 can be singulated or separated from each other by routering Or shearing or other methods known in the art. In this embodiment portions of the spacer sheet 84 become a permanent part of the enclosed circuit 72. Preferably, sufficient encapsulant 90 is utilized to give each enclosed circuit 72 a substantially flat top surface. As can be seen, the resulting circuit is completely encapsulated between the encapsulant 90, spacer sheet 84 and the substrate 74.

In the completed configuration, each circuit 72 will include the ink layer 75 visible through the substrate 74. Because the ink layer 75 is on the protected side of the substrate 74, it will have substantially improved wear characteristics. Additionally, the markings will be virtually tamper-proof and would be useful as an anti-counterfeiting measure.

Figure 7:
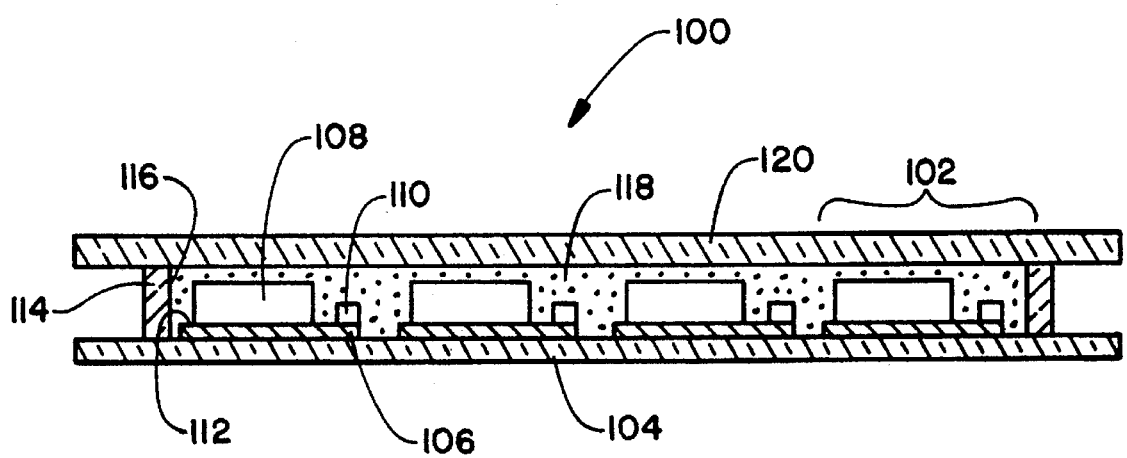
FIG. 7 is a cross-sectional view of an array of micro-circuits constructed in accordance with an alternate embodiment of the invention and shown prior to singulation.

In some situations it may be preferable for an additional flexible cover to be placed over the circuit array prior to singulation. One such circuit array is shown in FIG. 7. Similar to the previous embodiments, circuit array 100 includes a substrate 104 on which a conductive trace 106 is formed. Mounted onto the substrate 104 is a battery 108 and a die 110. As before, a portion of the conductive trace 106 is formed as an antenna 112. Still further, a perimeter dam 114 is attached to substrate 104, providing a cavity 116 which is filled by an encapsulant 118. In the view shown in FIG. 7, four enclosed circuits 102 are shown.

To provide for additional stability or additional protection from damage, an additional flexible cover 120 is attached to the top surface of the perimeter dam 114 and the encapsulant 118. The flexible cover 120 can be attached while the encapsulant is still in its liquid state or can be attached to the encapsulant with an adhesive or other suitable bonding means after the encapsulant 118 has hardened. While cover 120 is shown on a circuit array similar to that shown in FIGS. 3–4, it could be used on other similar circuits or circuit arrays like that shown in FIGS. 1–2 or FIGS. 5–6. Additionally while the flexible cover 120 is preferably a flexible material such as polyester or PET, some instances may require additional strength, and harder and less flexible materials may be used.

Figure 8:
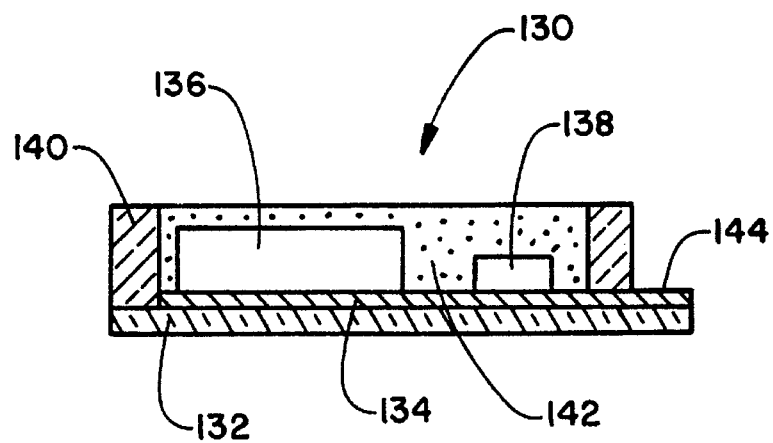
FIG. 8 is a cross-sectional view of an individual micro-circuit constructed in accordance with an alternate embodiment of the invention.

Referring now to FIG. 8, yet another embodiment of an enclosed circuit of the present invention is shown and generally designated 130. Circuit 130 is shown in its completed state post-singulation. The substrate 132 is preferably made of materials as previously described. A conductive trace 134 is formed on the substrate 132. Mounted on the substrate 132 in electrical communication with the conductive trace 134 are a battery 136 and a die 138. Also mounted to the substrate 132 is a barrier 140. The battery 136 and die 138 are within the cavity formed by substrate 132 and barrier 140. Filling the remainder of the cavity is an encapsulant 142.

In this embodiment the contact trace 134 extends out beyond the periphery of the barrier 140. In this manner a portion of contact trace 134 is on the outside of the circuit 130 and forms an edge connector 144 similar to standard circuit board connectors which will be recognized by those skilled in the art. Edge connector 144 could be connected to other circuits and components by physical contact or soldering or by other means known in the art. Enclosed circuit 130 could thus be used in a hard-wired assembly.

DETAILED DESCRIPTION OF PREFERRED METHOD OF MANUFACTURE

Figure 9:
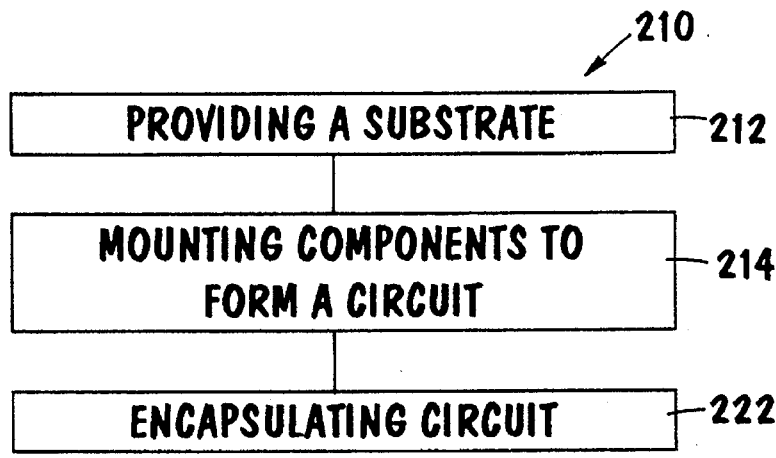
FIG. 9 is a flowchart showing an overview of the method of manufacture of the present invention.

A flowchart for the preferred method of manufacture is shown in broad steps in FIG. 9 and is generally designated 210. For method 210, a substrate is initially formed or provided, step 212. Depending on the nature of the qualities desired, the substrate can be made of a number of materials, although it is preferably flexible and, for the preferred embodiment, is normally material like polyester or PET.

Figure 10:
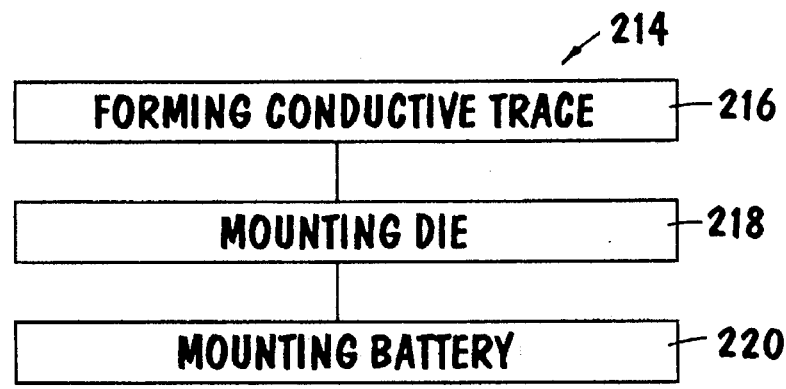
FIG. 10 is a flowchart of the substeps of a portion of the method of manufacture shown in FIG. 9.

After providing the substrate, step 212, the components of the circuit are mounted onto the substrate, step 214, such that a circuit is formed on the substrate. More specifically, for a typical circuit, the mounting components substep 214 is shown in FIG. 10. As shown in FIG. 10, a conductive trace is formed on the substrate, step 216. The conductive trace can be formed on the substrate using a variety of methods, including screen printing, etching and others that are known in the art. Next, a conductive adhesive is applied to the top surface of the substrate and the conductive trace. Preferably, the adhesive is a conductive adhesive. In the preferred configuration, this adhesive is applied in a layer approximately 2 mil. thick.

The electrical components of the circuitry can then be applied and mounted onto the substrate and are held in place by the adhesive. Specifically, for a particular circuit, a die can be placed onto the substrate, step 218. The die is positioned such that its electrical contacts (e.g., bond pads)

are immediately adjacent the appropriate locations on the conductive trace. In this manner, utilizing a conductive adhesive, electrical communication is established between the die and conductive trace.

Additionally, for a particular circuit, a battery can be mounted onto the substrate and also held in place by the adhesive, step 220. Both the positive and negative terminals of this battery are placed immediately adjacent the positive and negative contact trace of the conductive trace. In this manner, a circuit is formed between the battery, the die and the conductive trace. Depending on the type of battery, an additional conductive adhesive can be applied around the perimeter of the battery to provide additional electrical contact. This may be necessary where the positive and negative terminals of the batter are not coplanar.

Figure 11:
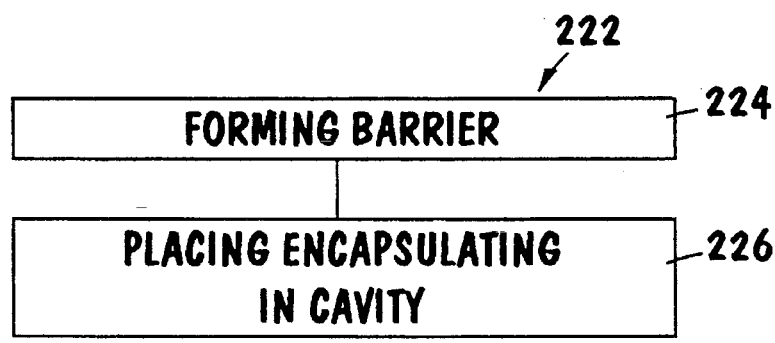
FIG. 11 is a flowchart of the substeps of a portion of the method of manufacture shown in FIG. 9.

Referring back again to FIG. 9, the final step in the method is to encapsulate the circuit, step 222. The substep of encapsulating the circuit, step 222, is shown in FIG. 11. First, a barrier to contain the encapsulant must be formed. Depending on the process, the barrier can be either a compartmentalized dam or spacer sheet having a number of openings or cut outs, one for each enclosed circuit, or a perimeter dam having a single opening surrounding a number of enclosed circuits.

Furthermore, the individual dam or spacer sheet can be manufactured by a variety of methods. Preferably, an initial piece of stock of, for example, black polycarbonate, is provided. This sheet is then cut to size for the overall dimensions of the individual dam. The individual openings (e.g., 24 or 85) can then be stamped or cut as required.

Alternatively, the sheet can be initially formed with openings (e.g., 24 or 85) such as by molding without departing from the scope of the present invention. Openings can have a standardized shape as is shown for openings 24 or could be designed to conform to the shape of the componentry like opening 85.

In FIG. 11, mounting the barrier onto the substrate is step 224. The barrier itself may be held in contact with the substrate using an adhesive or by bonding or by other means known in the art. Depending on the final desired characteristics of the enclosed circuit, a releasing agent can be applied to the barrier. If desired, the barrier could be applied to the substrate using a releasing agent, or be held in place using other non-permanent means like pressure, a magnetic field, and the like to allow the barrier to be reused.

After the barrier is installed onto the substrate, the cavity, which contains the circuit components, is substantially filled with an encapsulant, step 226. Depending on the type of encapsulant, the encapsulant is then allowed to dry or is cured. Once the encapsulant has hardened, the individual enclosed circuits can be singulated by routering or shearing or other means known in the art. If desired, the remaining portions of the barrier can be removed for reuse, trimmed away or can be left in contact with the individual enclosed circuits.

In some situations it may be preferable to include markings, e.g. lettering, numbering, logos or graphic representations on the enclosed circuit. This is accomplished in the method of the present invention by using a substrate that is substantially transparent. Prior to forming the conductive trace on the substrate, an ink layer is applied to the surface of the substrate by screen printing or other similar means. If multiple colors are desired, multiple layers can be applied. In order to be visible through the substrate, the images are applied in reverse orientation as will be appreciated by those skilled in the art.

If physical contact with the conductive trace is desired, the trace can be formed such that it extends out beyond the barrier to form an edge connector. When singulation is performed, the extension of the substrate including the edge connector is allowed to remain.

In the event additional structural stability or protection is desired, an additional cover can be added to the top of the barrier and the encapsulant prior to singulation. This cover can be a variety of materials, including flexible polyester or PET. It can be attached to the encapsulant while the encapsulant is still in its liquid state or it can be attached after the encapsulant has hardened using an adhesive or bonding or other means known in the art.

Thus, the invention provides an improved enclosed electrical circuit using an encapsulant. Furthermore, although the method of the invention has been described with reference to certain preferred embodiments and preferred methods, as will be apparent to those skilled in the art, certain changes and modifications can be made without departing from the scope of the invention as defined by the following claims.

We claim:

1. A method for manufacturing an encapsulated electrical circuit comprising:

forming a substrate;

forming an image on a surface of the substrate viewable through the substrate;

forming the circuit on the surface;

forming a barrier on the substrate to define a cavity surrounding the circuit; and placing an encapsulant in the cavity.

2. The method as claimed in claim 1 and further comprising:

mounting a die on the surface in electrical communication with the circuit; and mounting a battery on the surface in electrical communication with the circuit.

3. The method claimed in claim 1 and wherein the substrate is substantially transparent and the image comprises an ink layer applied to the surface.

4. The method as claimed in claim 1 and wherein the encapsulant comprises an epoxy in a viscous state when placed in the cavity and further comprising the step of curing the epoxy.

5. The method as claimed in claim 1 and further comprising applying a releasing agent to the barrier to allow separation of the barrier and encapsulant.

6. The method as claimed in claim 1 and wherein the barrier comprises a spacer sheet having the cavity formed as a cut out.

7. The method as claimed in claim 1 further comprising covering the encapsulant with a flexible cover.

8. A method for manufacturing an electrical circuit comprising:

forming a substrate;

forming a plurality of conductive traces on the substrate;

mounting electrical components on the substrate in electrical communication with the conductive traces to form a plurality of separate circuits;

placing a spacer sheet on the substrate comprising a plurality of separate cavities for the separate circuits;

depositing a curable compound into the cavities to encapsulate each of the separate circuits;

curing the compound; and singulating the substrate and spacer sheet to form a plurality separate encapsulated circuits.

9. The method as claimed in claim 8 and wherein the mounting step comprises:

mounting a die on the substrate for each separate circuit; and mounting a battery on the substrate for each separate circuit.

10. The method as claimed in claim 8 and further comprising covering the encapsulant with a flexible cover.

11. The method as claimed in claim 8 wherein the singulating step comprises a method selected from the group consisting of cutting, shearing and routering.

12. The method as claimed in claim 8 and wherein the conductive traces are formed by screen printing.

13. The method as claimed in claim 8 and further comprising forming the substrate of a substantially transparent material and forming an image on a surface of the substrate wherein the circuits are formed.

14. The method as claimed in claim 8 and further comprising forming the substrate of a transparent material and forming a reverse image on a surface of the substrate wherein the circuits are formed.

15. The method as claimed in claim 8 and further comprising forming a portion of the conductive trace as an antenna.

16. The method as claimed in claim 8 and further comprising forming an antenna on the substrate in electrical communication with the conductive trace.

17. An encapsulated circuit comprising:

a transparent flexible substrate;

an image formed on a surface of the substrate;

an electrical circuit formed on the surface; and an encapsulating layer covering the surface and the electrical circuit.

18. The encapsulated circuit as claimed in claim 17 and wherein the image comprises an ink layer.

19. The encapsulated circuit as claimed in claim 17 and wherein the electrical circuit comprises:

a conductive trace formed on the substrate;

a die mounted on the substrate in electrical communication with the trace;

a battery mounted on the substrate in electrical communication with the trace.

20. The encapsulated circuit as claimed in claim 19 wherein a positive terminal and a negative terminal of the battery are co-planar.

21. The encapsulated circuit as claimed in claim 17 wherein the encapsulating layer comprises a curable epoxy.

22. The encapsulated circuit as claimed in claim 17 wherein the encapsulating layer comprises an opaque material.

23. The encapsulated circuit as claimed in claim 17 and wherein the circuit comprises a die and a battery.

24. The encapsulated circuit as claimed in claim 23 wherein the die and battery are mounted to the substrate using a conductive adhesive.

25. The encapsulated circuit as claimed in claim 17 and further comprising a flexible cover formed on the encapsulant.

26. An encapsulated circuit comprising:

a transparent flexible substrate;

an electrical circuit formed on the substrate;

an ink layer applied to the substrate between the substrate and the electrical circuit to provide an image visible through the substrate; and an encapsulating layer covering the substrate and the electrical circuit with the electrical circuit encapsulated between the substrate and encapsulating layer.

27. The encapsulated circuit as claimed in claim 26 and wherein the electrical circuit comprises:

a conductive trace formed on the substrate;

a die mounted on the substrate in electrical communication with the trace;

a battery having a positive terminal and a negative terminal in electrical communication with the trace.

28. The encapsulated circuit as claimed in claim 26 and wherein the die and the battery are mounted on the substrate using a conductive adhesive.

29. A method for manufacturing an encapsulated electrical circuit comprising:

forming a substrate;

forming a plurality of circuits on the substrate;

placing a barrier on the substrate to define a single cavity surrounding the circuits;

forming an encapsulant in the cavity to encapsulate the circuits;

separating the barrier from the encapsulant; and separating the encapsulated circuit from a remainder of the circuits.

30. The method as claimed in claim 29 and further comprising applying a releasing agent to the barrier to facilitate separating the barrier from the substrate.

31. The method as claimed in claim 29 and wherein each circuit includes a battery, a semiconductor die and an antenna.

32. A method for manufacturing an encapsulated electrical circuit comprising:

forming a substrate;

forming a plurality of circuits on the substrate;

providing a compartmental dam comprising an opening for each of the circuits;

placing the dam on the substrate;

forming an encapsulant in the cavities to encapsulate the circuits;

separating the dam from the substrate; and separating the encapsulated circuit from a remainder of the circuits.

33. The method as claimed in claim 32 and further comprising applying a releasing agent to the dam to facilitate separating the dam from the substrate.

34. The method as claimed in claim 32 and wherein each circuit includes a battery, a semiconductor die and an antenna.

* * * * *